(12) United States Patent
Ashida et al.

(10) Patent No.: US 7,703,064 B2
(45) Date of Patent: Apr. 20, 2010

(54) MULTILAYERED CIRCUIT BOARD DESIGN SUPPORT METHOD, PROGRAM, AND APPARATUS FOR SUPPRESSING THERMAL DIFFUSION FROM SOLID-LAYER CONDUCTOR TO THROUGH HOLE

(75) Inventors: Takayuki Ashida, Kawasaki (JP); Kenichirou Tsubone, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 190 days.

(21) Appl. No.: 11/311,655

(22) Filed: Dec. 20, 2005

(65) Prior Publication Data
US 2007/0079276 A1    Apr. 5, 2007

(30) Foreign Application Priority Data
Sep. 22, 2005    (JP)    ............... 2005-275164

(51) Int. Cl.
G06F 17/50 (2006.01)
H03K 17/693 (2006.01)
H05K 1/00 (2006.01)
H05K 1/11 (2006.01)

(52) U.S. Cl. ............... 716/15; 716/2; 716/4; 174/250; 174/263; 174/265; 174/266

(58) Field of Classification Search ............... 716/2, 716/4, 15; 703/27; 438/106, 150, 667; 436/150; 324/207.13, 761; 257/680, 692, 698; 174/250, 174/260, 263, 264, 266; 164/80
See application file for complete search history.

(56) References Cited

U.S. PATENT DOCUMENTS 5,307,241 A * 4/1994 Pistilli ............... 361/784

5,438,478 A * 8/1995 Kondo et al. ............... 361/704

(Continued)

FOREIGN PATENT DOCUMENTS

JP    03-64990    3/1991

(Continued)

OTHER PUBLICATIONS

Knadle et al.; "Proof is in the PTH—assuring via reliability from chip carriers to thick printed wiring boards"; May 31-Jun. 3, 2005; Electronic Components and Technology Conference, 2005. Proceedings. 55th; pp. 406-414 vol. 1.*

(Continued)

*Primary Examiner*—Helen Rossoshek
(74) *Attorney, Agent, or Firm*—Staas & Halsey LLP

(57) ABSTRACT

A multilayered board data input unit inputs design data of a multilayered circuit board provided with through holes penetrating and mutually connecting solid-layer conductors disposed in a multilayer manner. A limitation rule setting unit sets a limitation rule for limiting the number of solid-layer conductors to be connected to the through holes. A separation processing unit separates connections of the solid-layer conductors to the through holes in the design data based on the limitation rule. At this time, when a solid-layer conductor to be separated from the through holes is selected as a candidate, the separation processing unit determines whether the solid-layer conductor is isolated by separation, when the solid-layer conductor is not isolated, determines isolation, and when the solid-layer conductor is isolated, stops separation.

16 Claims, 15 Drawing Sheets

U.S. PATENT DOCUMENTS

| | | | |
|---|---|---|---|
| 5,442,144 A * | 8/1995 | Chen et al. | 174/266 |
| 5,736,679 A * | 4/1998 | Kresge et al. | 174/250 |
| 5,773,988 A * | 6/1998 | Sayre et al. | 324/761 |
| 5,801,432 A * | 9/1998 | Rostoker et al. | 257/666 |
| 5,926,951 A * | 7/1999 | Khandros et al. | 29/843 |
| 5,942,906 A * | 8/1999 | Stowers et al. | 324/761 |
| 6,031,281 A * | 2/2000 | Kang et al. | 257/692 |
| 6,134,516 A * | 10/2000 | Wang et al. | 703/27 |
| 6,148,900 A * | 11/2000 | Yamasaki et al. | 164/80 |
| 6,259,039 B1 * | 7/2001 | Chroneos et al. | 174/263 |
| 6,385,758 B1 * | 5/2002 | Kikuchi et al. | 716/2 |
| 6,388,208 B1 * | 5/2002 | Kiani et al. | 174/266 |
| 6,418,007 B1 * | 7/2002 | Lacy et al. | 361/301.1 |
| 6,496,957 B1 * | 12/2002 | Kumagai | 716/4 |
| 6,562,654 B2 * | 5/2003 | Kresge et al. | 438/106 |
| 6,646,886 B1 * | 11/2003 | Popovich et al. | 361/748 |
| 6,785,873 B1 * | 8/2004 | Tseng | 716/4 |
| 6,847,853 B1 * | 1/2005 | Vinciarelli et al. | 700/97 |
| 7,151,229 B2 * | 12/2006 | Mueller | 174/260 |
| 7,260,476 B2 * | 8/2007 | Bringuel et al. | 701/213 |
| 7,298,030 B2 * | 11/2007 | McWilliams et al. | 257/680 |
| 2001/0007371 A1 * | 7/2001 | Kawaguchi | 257/698 |
| 2004/0032251 A1 * | 2/2004 | Zimmerman et al. | 324/207.13 |
| 2005/0186791 A1 * | 8/2005 | Hiatt | 438/667 |
| 2006/0065439 A1 * | 3/2006 | Oikawa | 174/264 |
| 2006/0194331 A1 * | 8/2006 | Pamula et al. | 436/150 |

FOREIGN PATENT DOCUMENTS

JP     11026930 A *    1/1999

OTHER PUBLICATIONS

Loner et al.; "Smart PCBs manufacturing technologies"; Aug. 30-Sep. 2, 2005; Electronic Packaging Technology, 2005 6th International Conference on; pp. 287-295.*

Trites et al.; "Embedded ferromagnetic technology"; Sep. 22-25, 1997; Electrical Insulation Conference, 1997, and Electrical Manufacturing & Coil Winding Conference. Proceedings; pp. 665-672.*

* cited by examiner

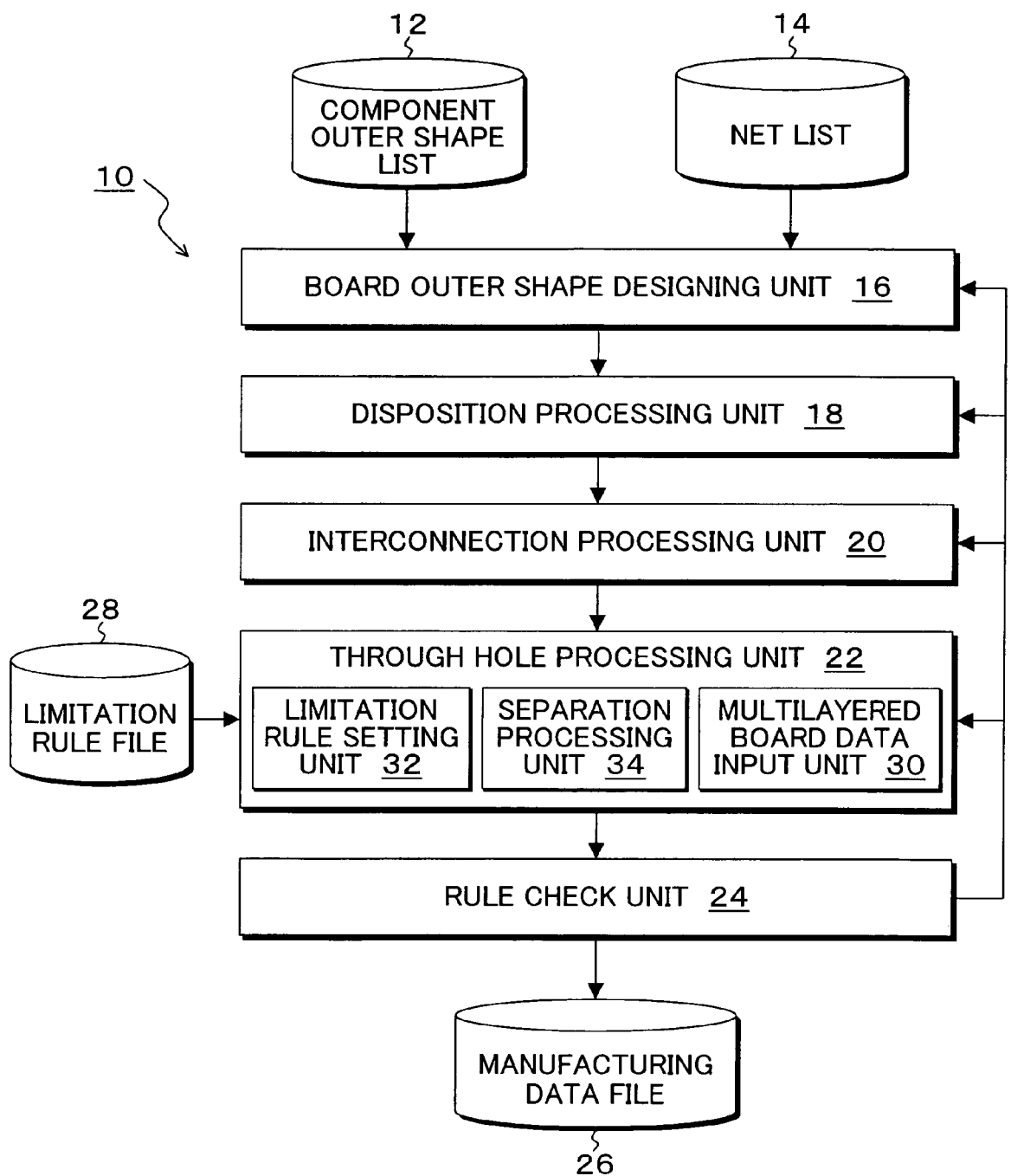

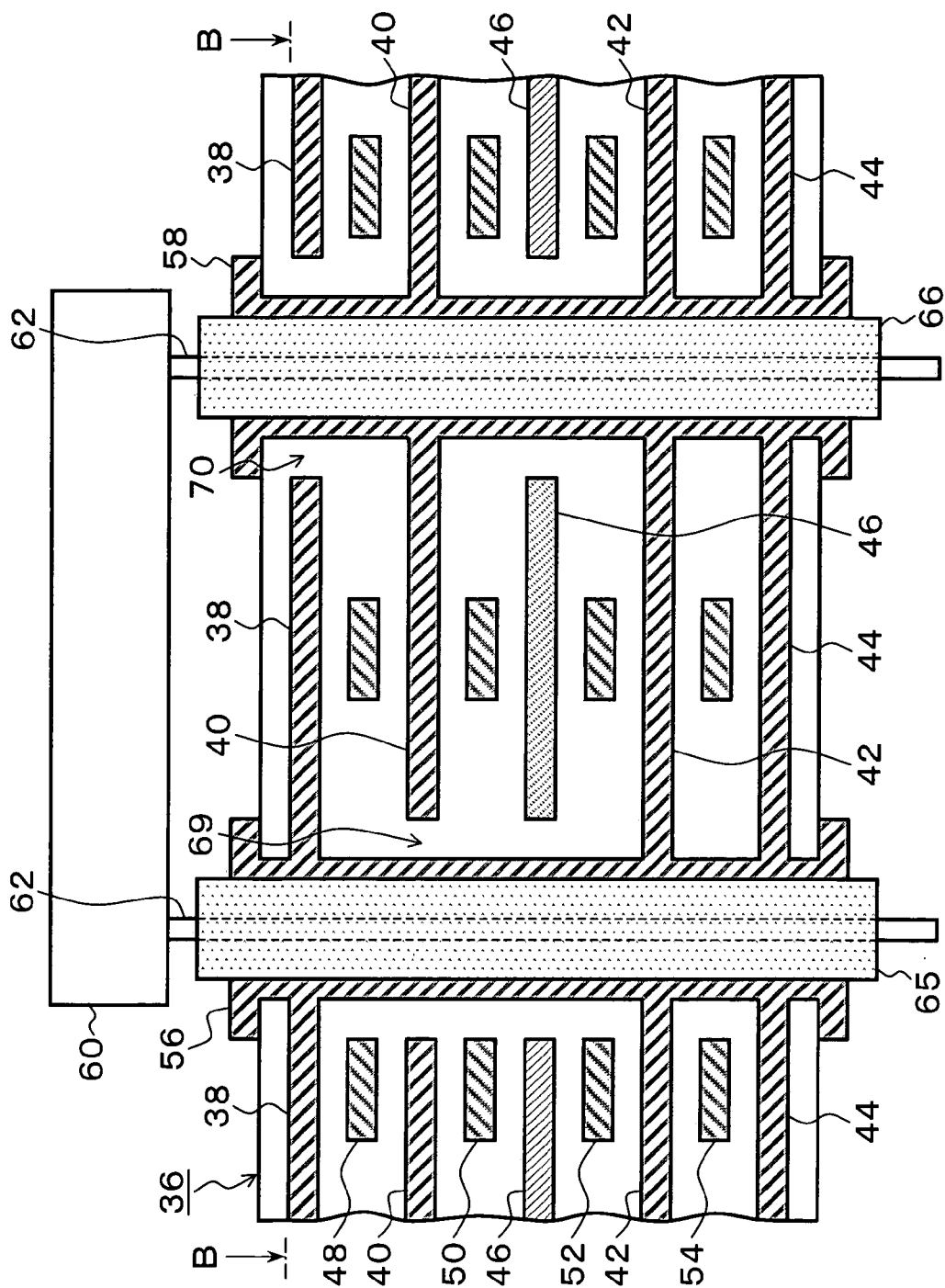

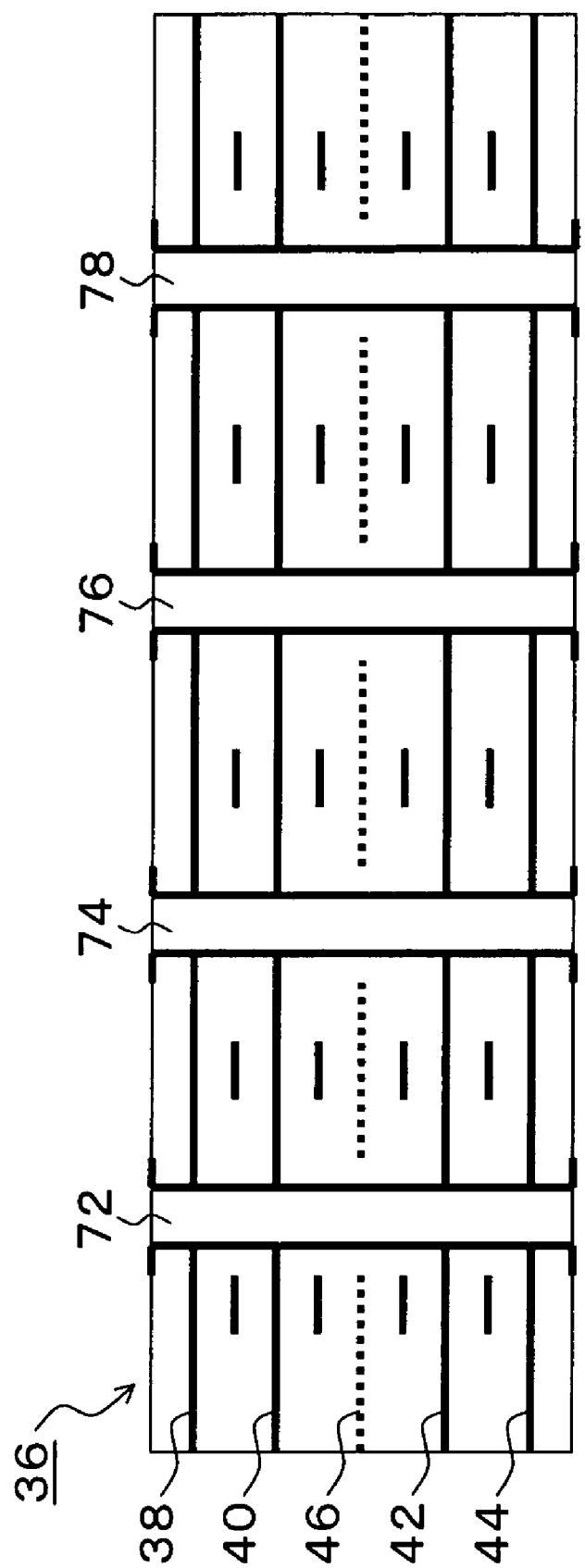

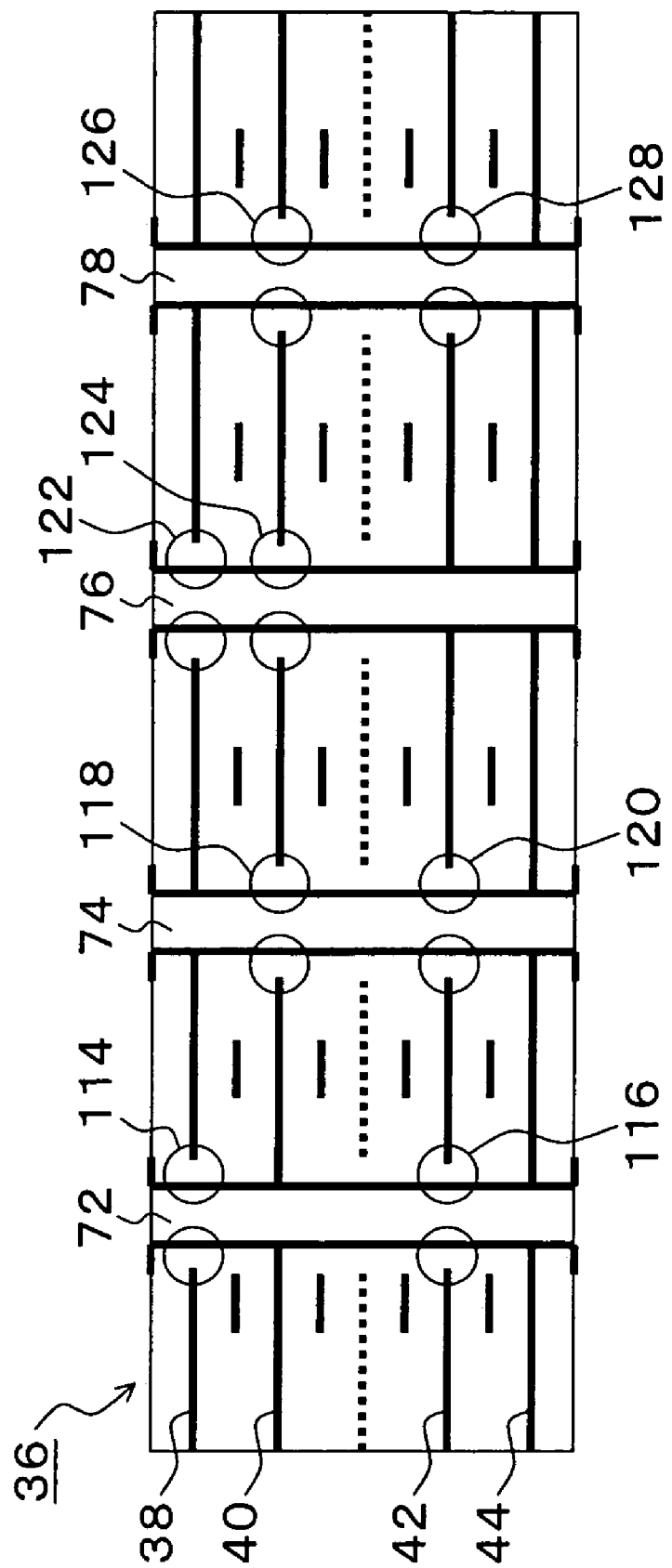

MULTILAYERED CIRCUIT BOARD DESIGN SUPPORT METHOD, PROGRAM, AND APPARATUS FOR SUPPRESSING THERMAL DIFFUSION FROM SOLID-LAYER CONDUCTOR TO THROUGH HOLE

CROSS-REFERENCE TO RELATED APPLICATIONS

This application is a priority based on prior application No. JP 2005-275164, filed Sep. 22, 2005, in Japan.

BACKGROUND

1. Field

The present invention relates to a multilayered circuit board design support method, program, and apparatus for a multilayered circuit board provided with a through hole for component insertion, the through hole penetrating and mutually connecting solid-layer conductors disposed in a multilayer manner, and such a multilayered circuit board. Particularly, the present invention relates to a multilayered circuit board design support method, program, and apparatus for designing a connection relation of ground and power-supply solid-layer conductors with respect to the through hole so that solder risability is improved, and a multilayered circuit board designed in such a manner.

2. Description of the Related Art

Conventionally, as a printed circuit board incorporated in electronic equipment, a multilayered circuit board is used in order to increase the packing density of components and circuit patterns for downsizing. The multilayered circuit board has formed therein a through hole for solder connection with ground and power-supply solid-layer conductors disposed in inner layers and leas of surface-mounted components.

FIGS. 1A and 1B depict a conventional multilayered circuit board with its section being shown in FIG. 1A and its C-C section being shown in FIG. 1B. A multilayered circuit board 200 has a multilayer structure including, in addition to two layers on the front and back, a signal conductor 201, a power-supply solid-layer conductor 203 and ground solid-layer conductors 202, 204, 206, and 208, in which through holes 210 and 212 are provided in order to connect leads 216 and 218 of a component 214 to the ground solid-layer conductors 202, 204, 206, and 208 by solders 220 and 222.

FIG. 1B is a section of the ground solid-layer conductor 202, in which the through holes 210 and 212 penetrate the ground solid-layer conductor 202 as being integrally connected. In a solder connecting operation of the multilayered circuit board 200, with the leads 216 and 218 of the component 214 being inserted in the through holes 210 and 212, respectively, the bottom surface of the multilayered circuit board 200 is dipped in a solder melting bath so that solder rises up to the top of the through holes 210 and 212 for connection. In this case, to cause solder to sufficiently rise up to the top of the through holes 210 and 212, it is required to prevent heat from escaping from the inner-layer conductors, such as the ground solid-layer conductors 202, 204, 206, and 208. To improve solder risability that would be prevented by thermal diffusion due to connections of inner-layer conductors to the through holes, for example, a gap in a divided-ring shape, such as an inverse-flower-shaped land, is provided between a through hole and a connection portion of a conductor, thereby suppressing thermal diffusion.

However, in such a conventional multilayered circuit board, depending on higher density of components, adaptation to the environment, and other factors, it is difficult to ensure solder risability only with the connection shape that suppresses thermal diffusion from the through hole to the inner-layer conductors. That is, with the number of layers of a printed circuit board being increased, the board thickness is increased and therefore the through hole is increased. At the same time, with an increase in the number of connection of conductive layers of the power and ground solid-layer conductors to a through hole for a component terminal, thermal radiation from the through hole is increased, thereby decreasing solder risability. Also, for environmental protection, it has been made mandatory to use Pb-free solder. Pb-free solder is, for example, lead-free solder of a tin-silver-copper group. With the adoption of such material, solder risability has been decreased. Moreover, with the use of Pb-free solder, a surface treatment of forming a coating on the surface of a printed wiring board has been adopted. This surface treatment further decreases solder risability.

SUMMARY

According to the present invention is to provide multilayered circuit board design method, program, and apparatus, and a multilayered circuit board for reliably suppressing thermal diffusion from an inner-layer conductor to a through hole to ensure solder risability.

The present invention provides a multilayered circuit board design support method. The multilayered circuit board design support method according to the present invention includes:

an input step of inputting design data of a multilayered circuit board provided with a through hole penetrating and mutually connecting solid-layer conductors disposed in a multilayer manner;

a limitation rule setting step of setting a limitation rule of limiting the number of solid-layer conductors to be connected to the through hole; and a separating step of separating connections of the solid-layer conductors to the through hole in the design data based on the limitation rule.

Here, in the separating step, when a solid-layer conductor to be separated from the through hole is selected as a candidate, it is determined whether the solid-layer conductor is isolated by separation, when the solid-layer conductor is not isolated, separation is determined, and when the solid-layer conductor is isolated, separation is stopped.

In the limitation rule setting step, a maximum number of solid-layer conductors to be connected to one through hole is set. In the limitation rule setting step, a maximum value of a total of thicknesses of solid-layer conductors to be connected to one through hole may be set.

In the separating step, the solid-layer conductors connected to the through hole are selected for separation preferentially from a component surface side opposite to a soldering surface. In the separating step, the solid-layer conductors connected to the through hole may be selected for separation preferentially from a solid-layer conductor adjacent to a solid-layer conductor of a different type of power supply.

In the separating step, the solid-layer conductors connected to the through hole may be randomly separated so as to satisfy the limitation rule.

In the limitation rule setting step, a setting of the limitation rule is changed for each of a power-supply solid-layer conductor and a ground solid-layer conductor.

In the limitation rule setting step, a setting of the limitation rule is changed in accordance with wiring board specifications including a board thickness, material, and the number of layers of the multilayered circuit board, and joint forms, including an inverse-flower-shaped land, of the solid-layer conductors to the through hole.

The present invention provides a multilayered circuit board design support program. The multilayered circuit board design support program according to the present invention causes a computer to execute steps including:

an input step of inputting design data of a multilayered circuit board provided with a through hole penetrating and mutually connecting solid-layer conductors disposed in a multilayer manner;

a limitation rule setting step of setting a limitation rule of limiting the number of solid-layer conductors to be connected to the through hole; and a separating step of separating connections of the solid-layer conductors to the through hole in the design data based on the limitation rule.

The present invention provides a multilayered circuit board design support apparatus. The multilayered circuit board design support apparatus according to the present invention includes: an input unit that inputs design data of a multilayered circuit board with through hole penetrating and mutually connecting solid-layer conductors disposed in a multilayer manner; a limitation rule setting unit that sets a limitation rule of limiting the number of solid-layer conductors to be connected to the through hole; and a separating unit that separates connections of the solid-layer conductors to the through hole in the design data based on the limitation rule.

Here, details of the multilayered circuit board design support program and apparatus according to the present invention are basically identical to those of the multilayered circuit board design support method according to the present invention.

Furthermore, the present invention provides a multilayered circuit board itself. In the present invention, the multilayered circuit board provided with solid-layer conductors disposed in a multilayer manner and a through hole penetrating and mutually connecting the solid-layer conductors includes a separation portion that separates, from the through hole, connections of a part of a plurality of solid-layer conductors connected to the through hole. The separation portion has a structure in which a ring-shaped hollow is formed so as to surround a through hole penetrating position on relevant one of the solid-layer conductors.

According to the present invention, by limiting the number of connections of the inner conductors to the through hole, thermal diffusion from the through hole is suppressed, and a temperature decrease of solder entering in the through hole is suppressed, thereby ensuring solder wettability. Even if the board thickness and the number of inner-layer conductors are increased with higher-density of components solder risability allowing solder to rise up to the top of the through hole can be sufficiently ensured. The above and other objects, features, and advantages of the present invention will become more apparent from the following detailed description with reference to the drawings.

BRIEF DESCRIPTION OF THE DRAWINGS

FIG. 2 is a block diagram of a multilayered circuit board design support apparatus according to the present invention;

FIGS. 5A and 5B are drawings for describing design results of a multilayered circuit board according to the present invention in which through holes and inner-layer conductors are connected through;

FIG. 6 is a drawing for describing a multilayered circuit board before a process of separating the inner-layer conductors;

FIG. 10 is a drawing for describing the multilayered circuit board after the separation process according to the present invention with random selection of solid-layer conductors to be separated a drawing for describing the multilayered circuit board after the separation process according to the present invention without limiting the number of separation.

DETAILED DESCRIPTION OF THE PREFERRED EMBODIMENTS

Figure 1A:
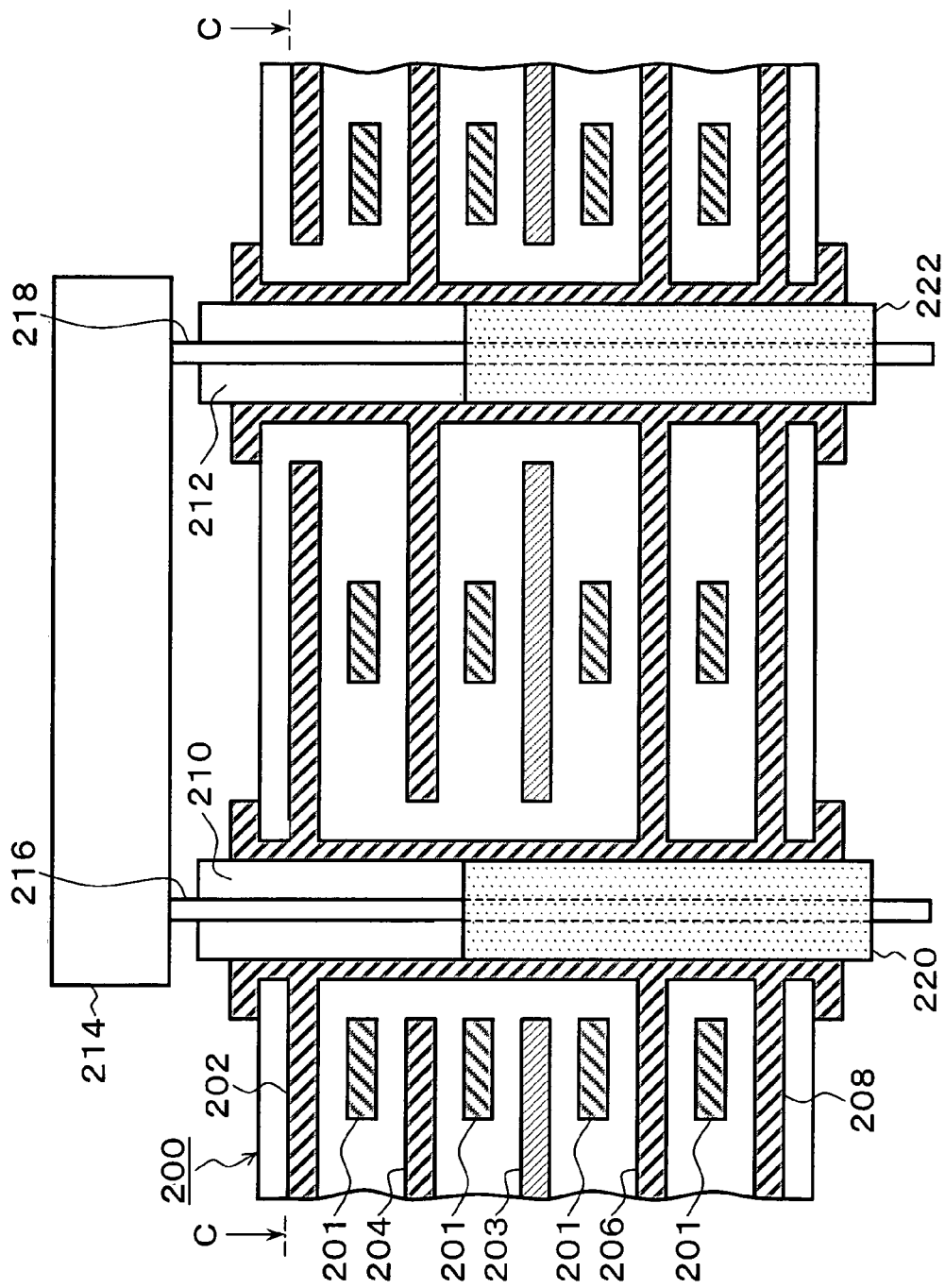
FIGS. 1A and 1B are drawings for describing a conventional multilayered circuit board with through holes penetrating through conventional inner-layer conductors for connection.
Figure 1B:
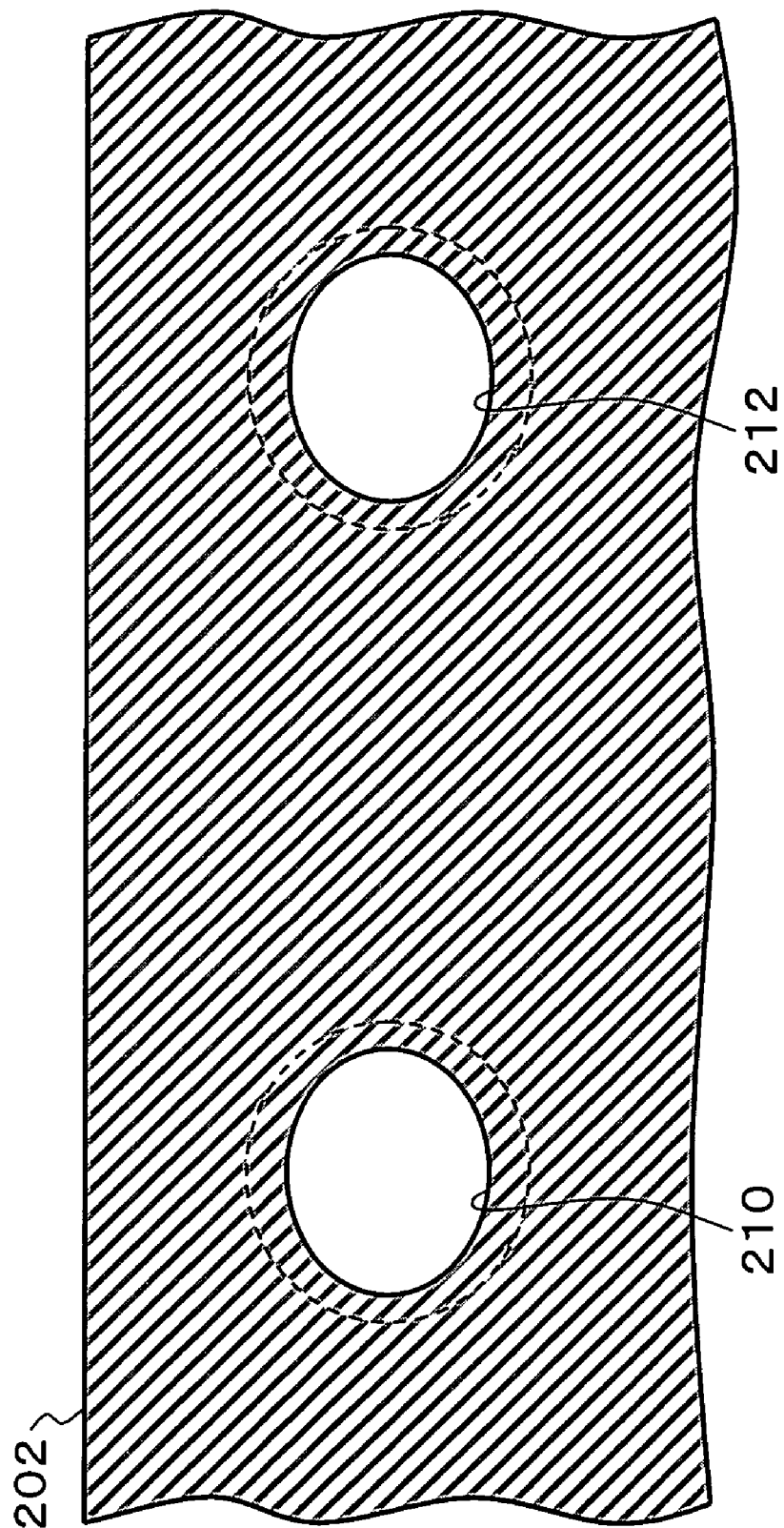

FIG. 2 is a block diagram of a multilayered circuit board design support apparatus according to one embodiment of the present invention. In FIG. 2, a multilayered circuit board design support apparatus 10 according to one embodiment of the present invention includes functions provided by an execution environment of a computer, and includes a component outer shape list 12, a net list 14, a board outer shape designing unit 16, a disposition processing unit 18, an interconnection processing unit 20, a through hole processing unit 22, a rule check unit 24, a manufacturing data file 26, and further a limitation rule file 28 for use in the through hole processing unit 22. The through hole processing unit 22 includes functions of a multilayered board data input unit 30, a limitation rule setting unit 32, and a separation processing unit 34. The component outer shape list 12 has registered therein outer shape information of components to be actually disposed in a manufacturing stage. The outer shapes of components registered in the component outer shape list 12 particularly include sizes of components occupying a multilayered circuit and connection points. For example, for discrete components, their outer shapes and circuit connection points are registered. For ICs, their packages, distances between pins, and others are registered. The net list 14 has registered therein information indicative of connections between components in a circuit. Specifically, a net list output from a circuit design system using CAD is used. The board outer shape designing unit 16 designs an outer shape defined by a length, a width, and a height of a multilayered circuit board on which a circuit provided based on the net list 14 is mounted. In this case, the thickness of the board is a thickness depending on the number of inner layers to be formed in a thickness direction. Since one normal circuit board has a two-layer structure with a front surface and a back surface, the multilayered circuit board herein can be a board having more layers than those of the above, that is, a circuit board having four or more layers. Multilayered circuit boards targeted by the present invention are those having many layers, such as eight or sixteen layers. The disposition processing unit 18 disposes, in accordance with a component disposition on the net list 14, components taken out from the component outer shape list 12 also on component surfaces of the multilayered circuit board whose outer shape has been designed. The interconnection processing unit 20 performs, based on the net list 14, interconnection for each layer on the multilayered circuit board having disposed thereon the components. This multilayered circuit board design process by the board outer shape designing unit 16, the disposition processing unit 18, and the interconnection processing unit 20 is carried out while design contents are displayed on a display and command instructions from a designer are received. The through hole processing unit 22 carries out separation of connection between through holes and inner-layer conductors so as to improve solder risability, the separation being performed on the circuit board whose design has been completed through the process by the units up to and including the interconnection processing unit 20. The rule check unit 24 applies rules regarding dimensional physical conditions set in advance to the design-completed multilayered circuit board. If rule violation occurs, designing is carried out again by returning to a necessary previous stage. Upon completion of the rule check in the rule check unit 24, Gerber data for creating a board manufacturing film is stored in the manufacturing data file 26, and this is then delivered to a manufacturing section. The multilayered board data input unit 30 of the through hole processing unit 22 according to the present invention inputs design data of a multilayered circuit board whose design has been completed through the process by the units up to and including the interconnection processing unit 20 and which is provided with a plurality of through holes for penetrating and mutually connecting ground solid-layer conductors and a power-supply solid-layer conductor disposed in a multilayer manner. The limitation rule setting unit 32 sets, to the separation processing unit 34, limitation rules for limiting the number of solid-layer conductors to be connected to a through hole, based on the limitation rule file 28. Based on the set limitation rules, the separation processing unit 34 performs a process of separating connection of the solid-layer conductors to the through hole. Here, the limitation rules stored in the limitation rule file 28 for use in the process of separating connection of the solid-layer conductors to the through hole are described as follows. As the limitation rules, first set is a number-of-connections limitation rule. The number-of-connections limitation rule sets the number of solid-layer conductors to be connected to one through hole. This number-of-connections limitation rule includes the following two:

(1) a maximum number of connections Nmax; and (2) a maximum thickness Tmax.

The maximum number of connections Nmax is effective when all solid-layer conductors have the same thickness. On the other hand, if each solid-layer conductor has a different thickness, such a limitation by number is not suitable. In this case, a limitation by the maximum thickness Tmax is performed. The maximum number of connections Nmax and the maximum thickness Tmax in the number-of-connection limitation rule are set so that, when a lead of a component is inserted into a through hole to attach a solder surface to a solder layer, thermal diffusion of the inner layers to the solid-layer conductors can be suppressed so as to allow solder to rise up to the top of a through hole, that is, so that the temperature of the solder entering the through hole can be sufficiently maintained. The smaller these maximum number of connections Nmax and the maximum thickness Tmax are, the more improved solder risability is. Also, the limitation rule file 28 has set therein a separation priority rule. The separation priority rule defines which solid-layer conductor(s) is to be separated from a through hole, from out of a plurality of solid-layer conductors disposed in inner layers of the multilayered circuit board. The separation priority rule includes the following three, for example:

(1) solid-layer conductors are separated preferentially from the component surface side opposite to the solder surface of the multilayered circuit board;

(2) a solid-layer conductor adjacent to a solid-layer conductor of a different type is preferentially separated; and (3) a solid-layer conductor is randomly selected for separation.

Here, in the separation priority rule (1), connection is separated preferentially from the component surface side away from the solder surface, thereby suppressing thermal diffusion when solder rises up to the top of the through hole to ensure solder wettability. In "the number-of-connections limitation rule" and "the separation priority rule" provided in the limitation rule file 28, different limitation rules can be set to the power-supply solid-layer conductor and the ground solid-layer conductors disposed in the inner layers of the multilayered circuit board. Also, in accordance with the wiring board specifications including the thickness, material, and total layer number of the multilayered circuit board, and the connection forms, including an inverse-flower-shaped land, of the solid-layer conductors to the through holes, appropriate limitation rules are defined in the limitation rule file 28 for selection and setting as required. Based on the "the number-of-connections limitation rule" and the "separation priority rule" selected by the limitation rule setting unit 32 from the limitation rule file 28, the separation processing unit 34 performs a process of separating, in units of through holes in the multilayered circuit board, solid-layer conductors connected to the through hole. In this separation process, a "solid-layer-conductor-isolation-prohibited rule" is applied. In the solid-layer-conductor-isolation-prohibited rule, even if a solid-layer conductor satisfies the limitation rules and can be separated, it is determined whether the solid-layer conductor is isolated by being separated from the through hole. If it is not isolated, it is determined to be separated. However, if it is isolated, separation of the solid-layer conductor from the through hole is cancelled even if the solid-layer conductor satisfies the limitation rules. Therefore, even with the limitation rules being set, the number of solid-layer conductors to be separated may not satisfy the limitation rules. This is, however, a state occurring only at a limited part of the through hole when viewed as a whole, and even if the limitation rules are not satisfied, at least a part of the through hole is separated from the solid-layer conductors. Thus, compared with the conventional case where all are connected, solder risability is sufficiently improved, although not perfectly.

Figure 3:
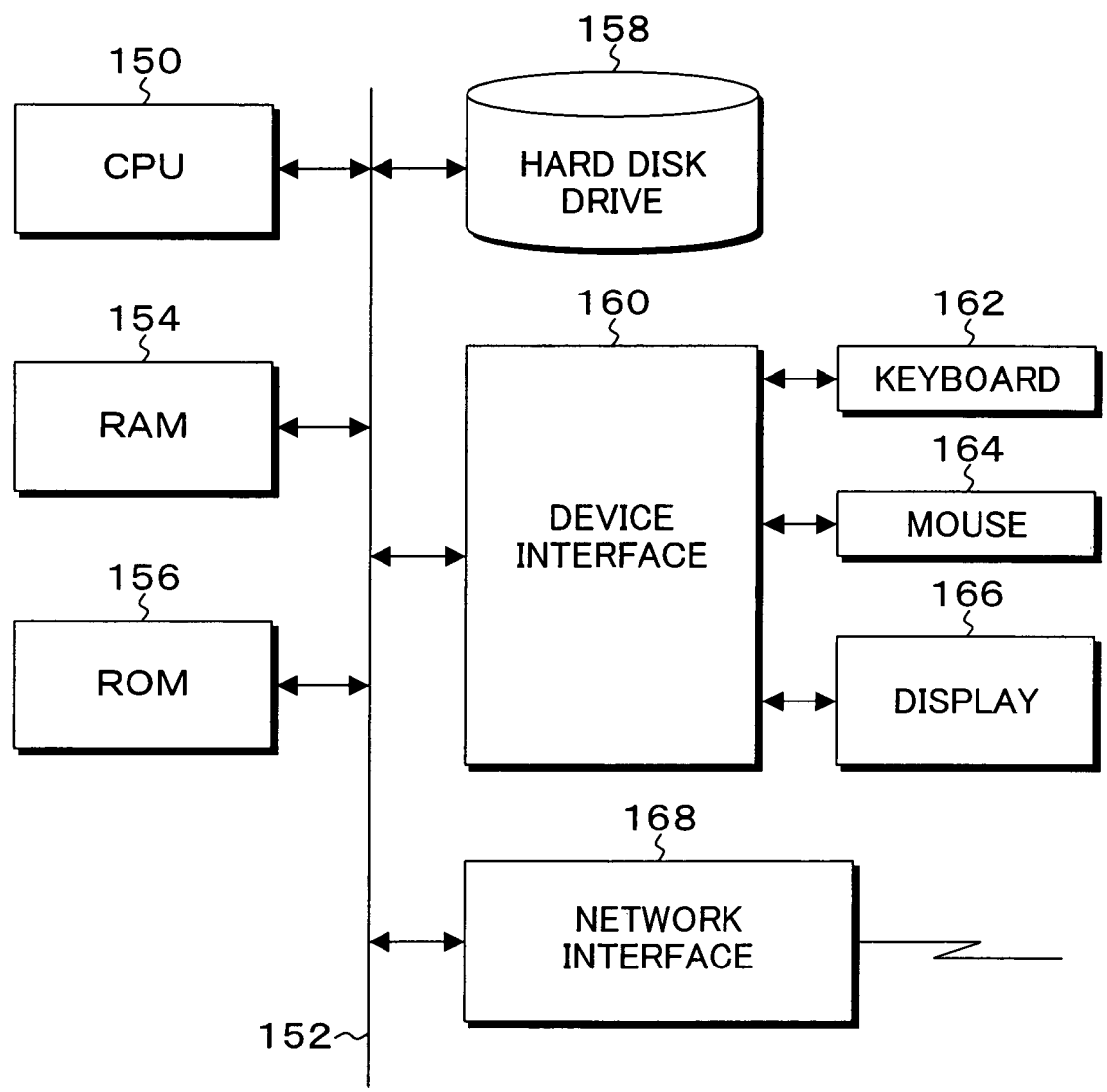
FIG. 3 is a block diagram of a hardware environment of a computer that achieves the apparatus shown in FIG. 2.

FIG. 3 is a block diagram of a hardware environment of a computer that achieves the multilayered circuit board design support apparatus 10 shown in FIG. 2. In FIG. 3, the computer has a CPU 150. Connected to a bus 152 of the CPU 150 are a RAM 154; a ROM 156; a hard disk drive 158; a device interface 160 having connected thereto a keyboard 162, a mouse 164, and a display 166; and further a network interface 168. A multilayered circuit board design support program according to the present embodiment is stored in the hard disk drive 158, is read to the RAM 154 when the computer is started, and is executed by the CPU 150, thereby achieving the function as the multilayered circuit board design support apparatus shown in FIG. 2.

Figure 4A:
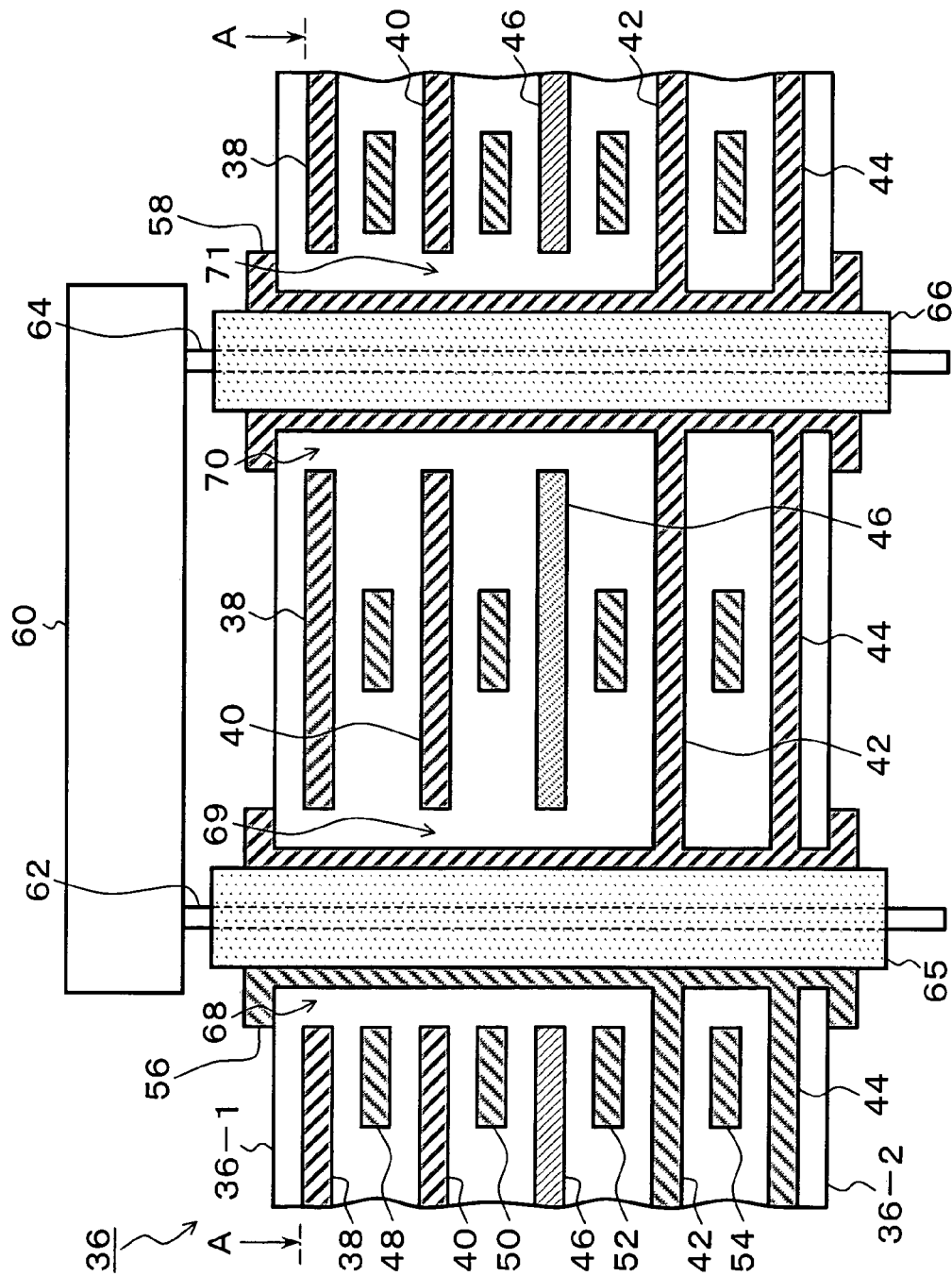
FIGS. 4A and 4B are drawings for describing a multilayered circuit board designed according to the present invention.
Figure 4B:
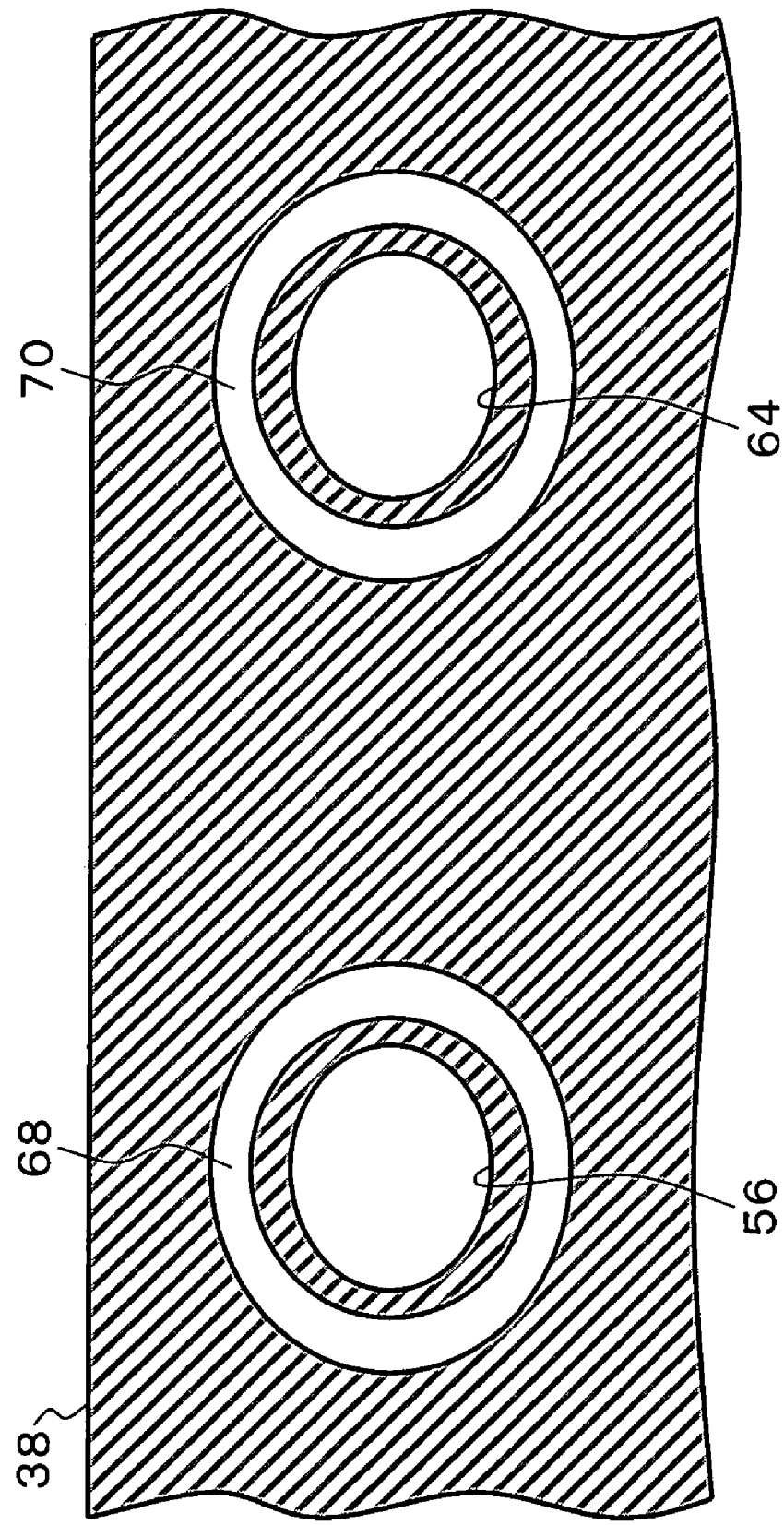

FIGS. 4A and 4B are drawings for describing a multilayered circuit board designed according to the present embodiment. FIG. 4A is a section view of a multilayered circuit board 36, and FIG. 4B is an A-A section of the multilayered circuit board 36.

In FIGS. 4A and 4B, the multilayered circuit board 36 has disposed in its inner layers between a component surface 36-1 at the top and a solder surface 36-2 at the bottom, for example, ground solid-layer conductors 38, 40, 42, and 44. Between the ground solid-layer conductors 40 and 42, a power-supply solid-layer conductor 46 is disposed. Furthermore, among the ground solid-layer conductors 38, 40, 42, and 44 and the power-supply solid-layer conductor 46, signal conductors 48, 50, 52, and 54 are disposed. In the multilayered circuit board 36 having such a multilayer structure, through holes 56 and 58 are formed so as to penetrate from the component surface 36-1 to the solder surface 36-2. As for conductor portions forming the through holes 56 and 58, the through holes penetrate as being connected to two ground solid-layer conductors 42 and 44 positioned on the solder surface 36-2 side. However, two ground solid-layer conductors 38 and 40 positioned on the component surface 36-1 side are in a separation state by separation portions 68 and 70 and separation portions 69 and 71. Here, the ground solid-layer conductors 38 and 40 separated from the through holes 56 and 58 are in a connection state at positions of other through holes, and therefore, when viewed as a whole, the ground solid-layer conductors 38, 40, 42, and 44 are integrally connected via the through holes 56 and 58 and other many through holes and are electrically connected at the same ground level. To the through holes 56 and 58, leads 62 and 64, respectively are inserted through component mounting. With the leads 62 and 64 being inserted in these through holes 56 and 58, when the solder surface 36-2 side of the multilayered circuit board 36 is dipped into a Pb-free solder layer, solder rises up to the top of these through holes by passing through a gap between the through hole 56 and the lead 62 and a gap between the through hole 58 and the lead 64, as shown by solders 65 and 66. With this, the leads 62 and 64 can be reliably connected to the through holes 56 and 58, respectively. In this case, as for the through holes 56 and 58, from out of four ground solid-layer conductors 38, 40, 42, and 44 provided in the inner layers, two ground solid-layer conductors 38 and 40 on the component surface 36-1 side are separated from the through holes 56 and 58 by the separation portions 68, 69, 70, and 71. Therefore, when solder rises up through the through holes 56 and 58, thermal diffusion to the ground solid-layer conductors 38 and 40 are almost completely cut off. Even if the solders 65 and 66 rise up to the top of the through holes 56 and 58, respectively, the temperature is almost not decreased, and solder can rise up to the top surface of the through holes with sufficient wettability.

In the A-A section of FIG. 4B, shapes of the separation portions 68 and 70 of the ground solid-layer conductor 38 with respect to the through holes 56 and 68, respectively. The separation portions 68 and 70000 are achieved by forming ring-shaped cutouts outside of the conductor portions of the through holes 56 and 58, respectively.

Figure 5B:
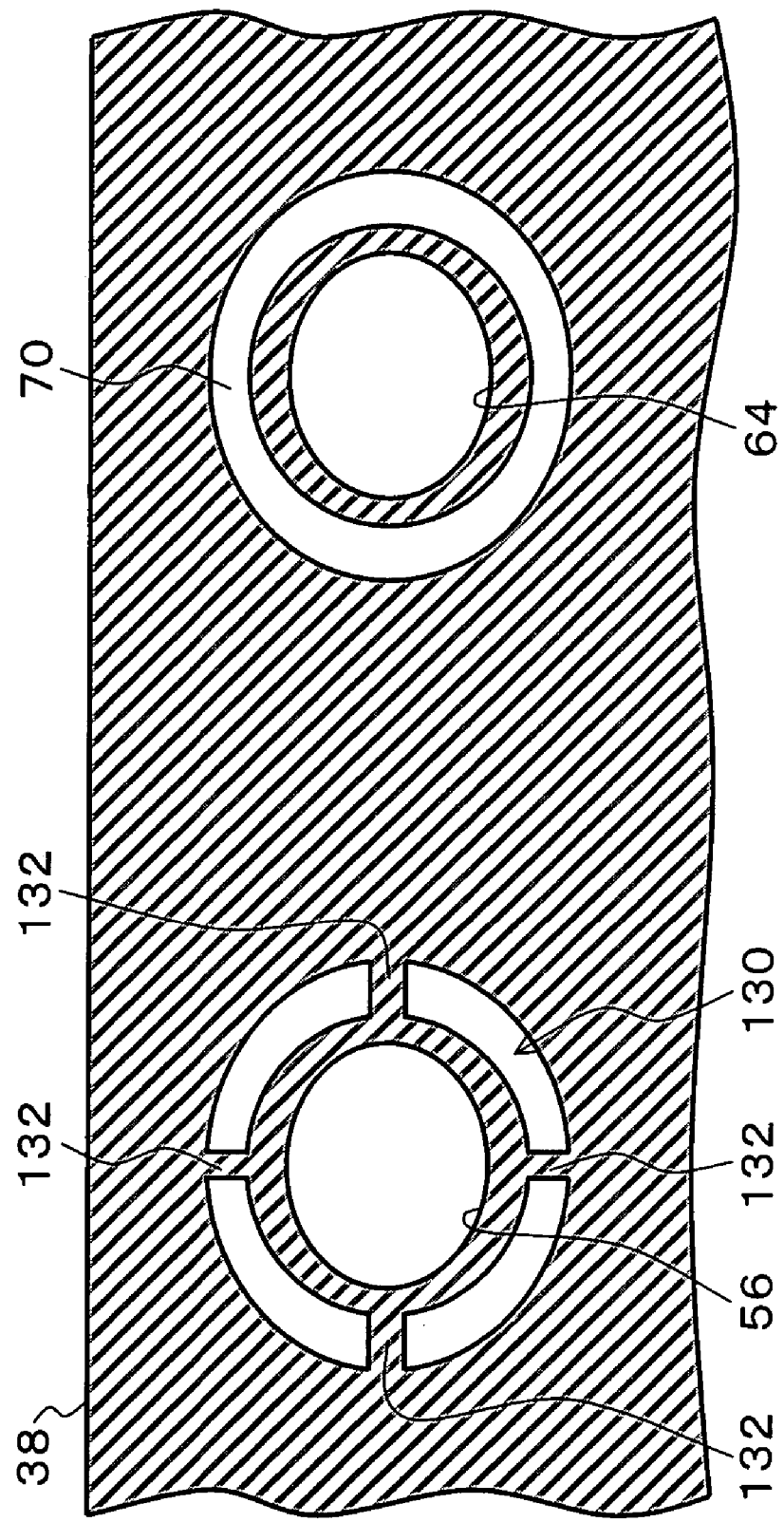

FIGS. 5A and 5B are drawings for describing a multilayered circuit board designed according to the embodiment of the present invention in which through holes and inner-layer conductors are connected through an inverse-flower-shaped land. A multilayered circuit board 36 of FIG. 5A is identical in multilayer structure to that of FIG. 4A, but as FIG. 5B showing its B-B section, connection of the ground solid-layer conductor 38 with respect to the through hole 56 on the left side is made through an inverse-flower-shaped land 130. In this connection through the inverse-flower-shaped land 130, a conductor cutout portion in a divided ring shape connected by lands 132 in four directions is formed to surround a portion of the conductor forming the through hole 56. The portion of the conductor forming the through hole 56 and the ground solid-layer conductor 38 are connected to each other by being limited by the lands 132 on the inverse-flower-shaped land 130. Therefore, thermal diffusion when solder enters the through hole 56 is suppressed by the lands 132, thereby improving solder risability. In the case where the connection is made to the through hole with the inverse-flower-shaped land 130 suppressing thermal diffusion with respect to the inner-layer conductor, compared with the connection of FIGS. 4A and 4B, equivalent solder risability can be ensured even if the number of connections is increased. Thus, in the case of FIG. 5A, in contrast to the number of connections being set as two in FIG. 4A, the number of connections is set as three, for example, the separation portion 69 is formed to the ground solid-layer conductor 40 for the through hole 56, and the separation portion 70 is formed to the ground solid-layer conductor 38 for the through hole 58. As such, one separation portion is provided for each ground solid-layer conductor. Next, details of the procedure of a process to be performed by the through hole processing unit 22 of FIG. 2 for separating inner layer media for improving solder risability with respect to a through hole are specifically described.

FIG. 6 is a drawing for describing the multilayered circuit board 36 before a process of separating the inner-layer conductors based on the input data of the multilayered board data input unit 30 of FIG. 2. In this multilayered circuit board 36 before the separation process, four through holes 72, 74, 76, and 78 are formed, for example, and, as with the case of FIGS. 4A and 4B, four ground solid-layer conductors 38, 40, 42, and 44 are disposed between the component surface and the solder surface and are all connected to the through holes 72 to 78. Here, dotted lines represent the power-supply solid-layer conductor 46.

Figure 7:
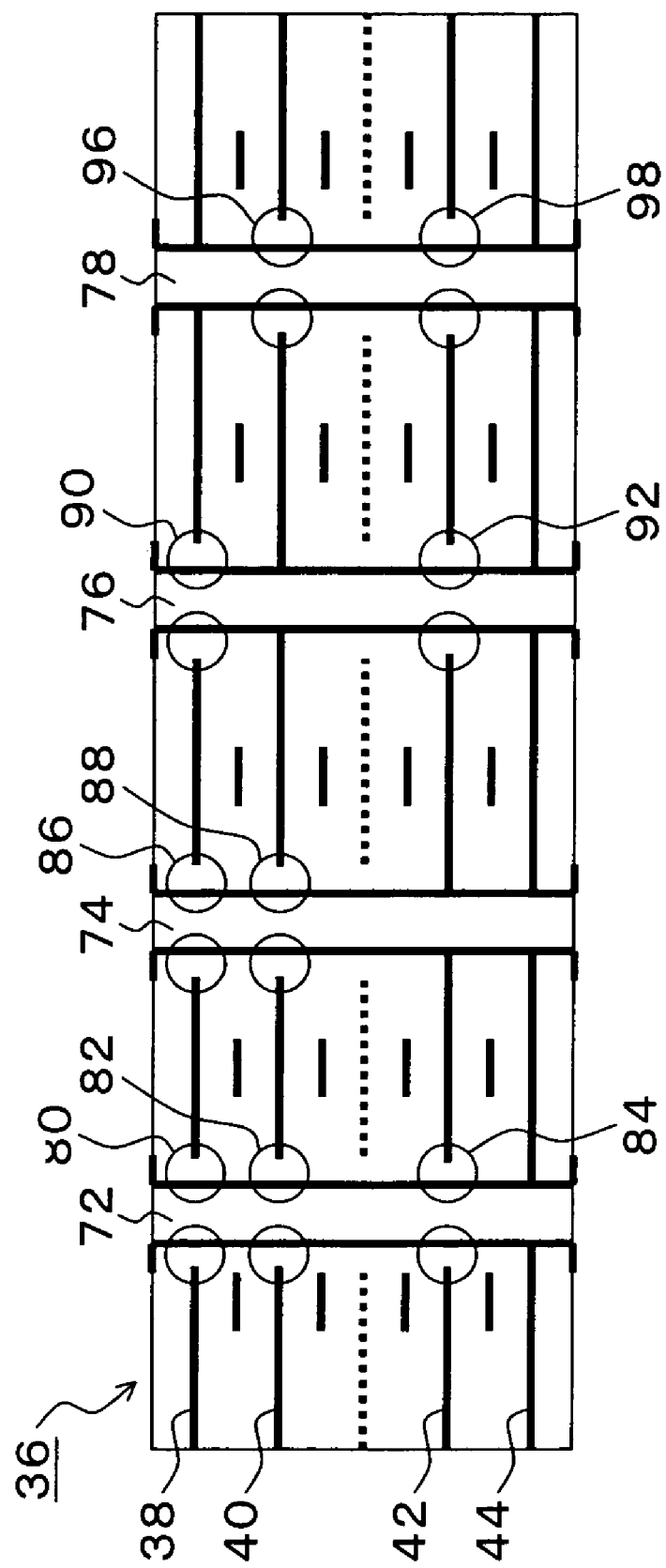
FIG. 7 is a drawing for describing the multilayered circuit board after the separation process according to the present invention without setting limitation rules.

FIG. 7 is a drawing for describing the multilayered circuit board after the separation process according to the present invention by applying only the solid-layer-conductor-isolation-prohibited rule" in the separation processing unit 34 without setting limitation rules by the limitation rule setting unit 32. In FIG. 7, prior to a separation process, it is a condition that all of the through holes 72 to 78 and ground solid-layer conductors 38 and 44 will not be in an isolation state, in which they are not electrically connected to one another. To achieve this, in this example, a fixed connection is set as an initial setting in which, for the ground solid-layer conductor 44 close to the solder surface 36-2, a connection relation with all of the through holes 72 to 78 is set as a fixed connection, the through hole 74 is fixedly connected to the ground solid-layer conductor 42, the through hole 76 is fixedly connected to the ground solid-layer conductor 40, and further the through hole 78 is fixedly connected to the ground solid-layer conductor 38. Thereafter, a separation process is performed. Therefore, the separation process is applied to connection portions other than the portions fixedly connected to the through holes 72 to 78. In this case, for the through hole 72, separation portions 80, 82, and 84 are formed for the three ground solid-layer conductors 38, 40, and 42, respectively. For the through hole 74, separation portions 86 and 88 are formed for the two ground solid-layer conductors 38 and 40, respectively. For the through hole 76, separation portions 90 and 92 are formed for the two ground solid-layer conductors 38 and 42, respectively. Furthermore, for the through hole 78, separation portions 96 and 98 are formed for the two ground solid-layer conductors 40 and 42, respectively. This separation state of FIG. 7 represents a maximum separation state in which the ground solid-layer conductors 38 to 44 can be separated from the through holes without being isolated from the through holes 72 to 78.

Figure 8:
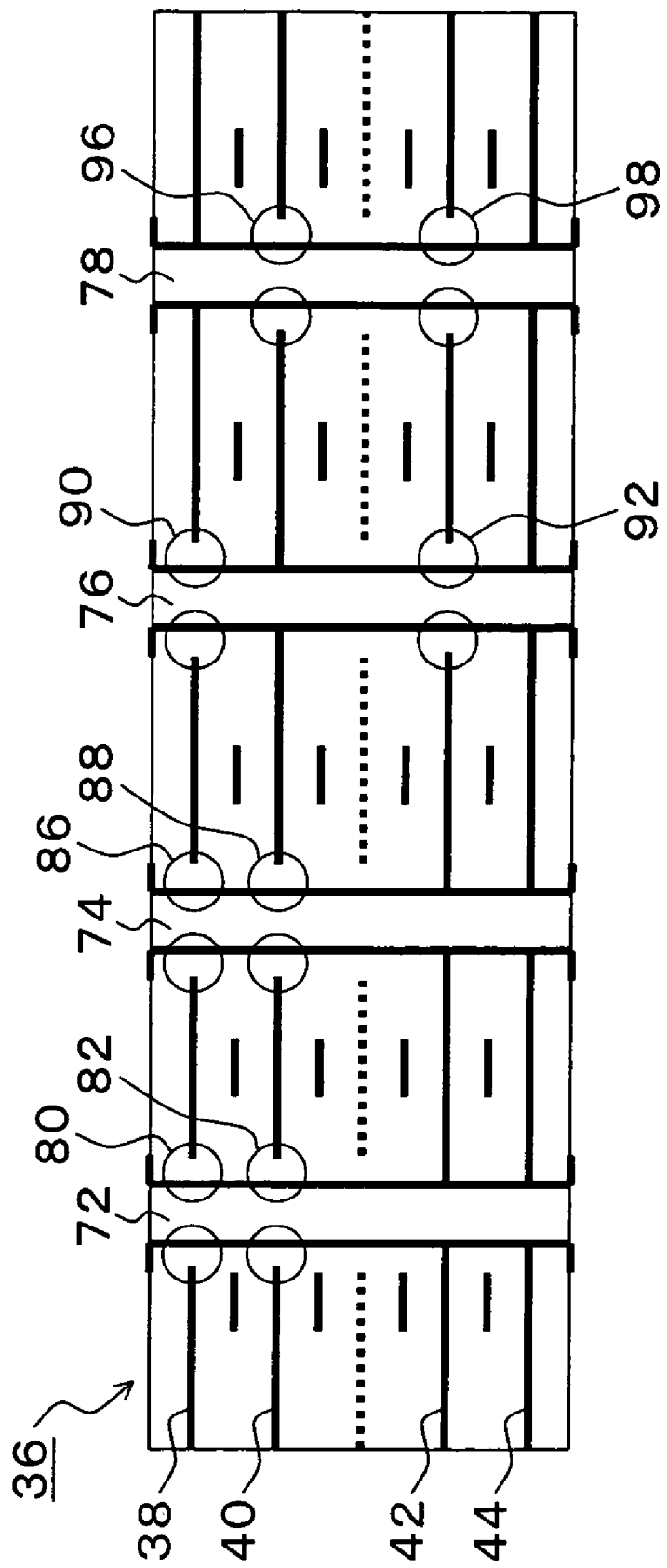
FIG. 8 is a drawing for describing the multilayered circuit board after the separation process according to the present invention with the number of separation being limited to two.

FIG. 8 is a drawing for describing a case where a separation process is performed on the multilayered circuit board 36 of FIG. 6 with "the maximum number of connections Nmax=2" being set as the number-of-connections limitation rule and "separation is made preferentially from the component surface side" being set as the separation priority rule. Also in this case, a fixed connection so as not to isolate the through holes 72 to 78 and the ground solid-layer conductors 38 to 44 by separation is similar to that of FIG. 7, the connection portion other than those in the fixed connection are subjected to a separation process, thereby rendering a connection state of all of the through holes 72 to 78 as a state in which the maximum number Nmax=2, that is, the number of portions to be separated is two for each through hole.

Figure 9:
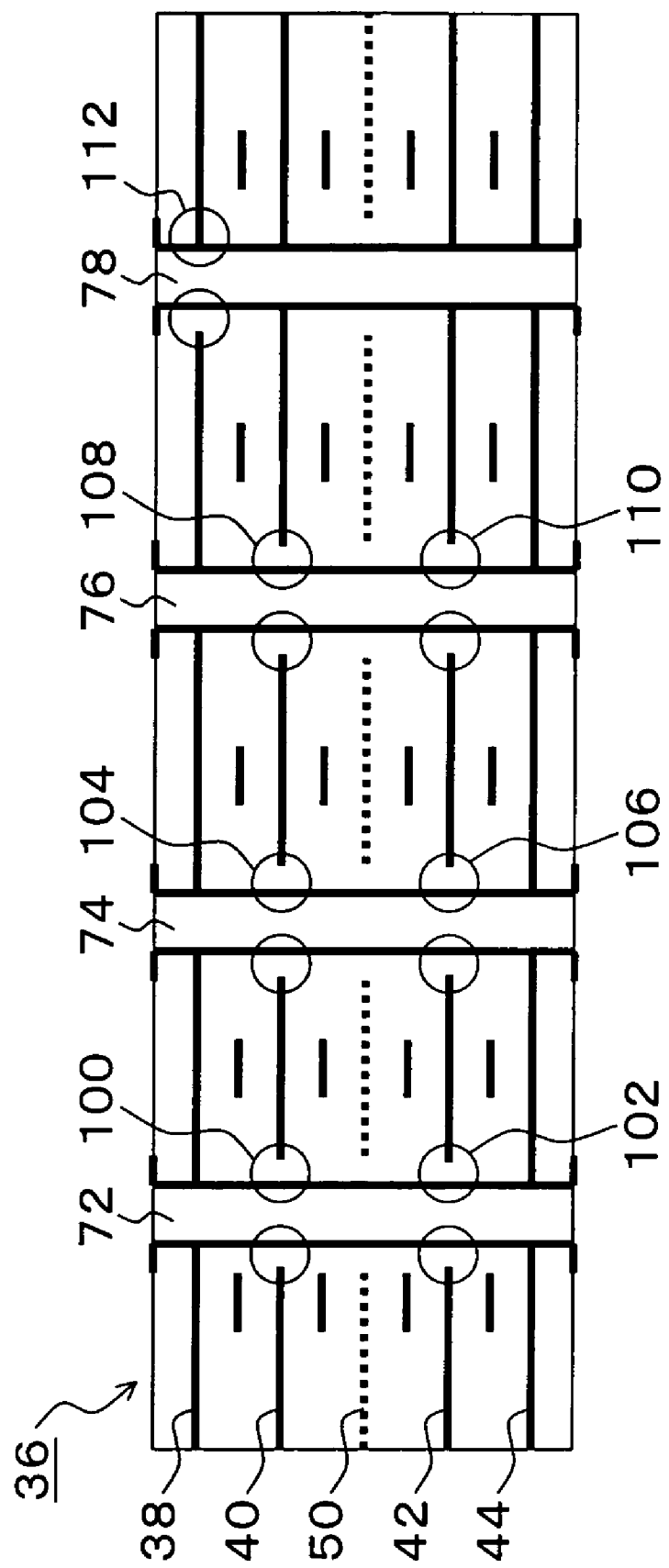
FIG. 9 is a drawing for describing the multilayered circuit board after a process of preferentially separating a solid-layer conductor adjacent to a solid-layer conductor of a different type of power supply according to the present invention.

FIG. 9 is drawing for describing the multilayered circuit board after a separation process with "the maximum number of connections Nmax=2" being set as the number-of-connections limitation rule and "separation is made preferentially from a solid-layer conductor adjacent to a solid-layer conductor of a different type" being set as the separation priority rule. In this multilayered circuit board 36, for the ground solid-layer conductors 40 and 42 adjacent to the power-supply solid-layer conductor 46 positioned at the center, two separation portions 100 and 102, two separation portions 104 and 106, and two separation portions 108 and 110 are formed for the through holes 72, 74, and 76, respectively. For the through hole 78, under the condition setting of the prohibition of isolation of an inner layer medium, only the ground solid-layer conductor 38 is separated by a separation portion 112.

FIG. 10 is a drawing for describing the multilayered circuit board after the separation process with "the maximum number of connections Nmax=2" being set as the number-of-connections limitation rule and "separation is randomly made for separation" being set as the separation priority rule. In this case, a separation process in which separation portions 114 to 128 are formed so as to satisfy "the maximum number of connections Nmax=2" among the remaining three ground solid-layer conductors 38, 40, and 42 other than the ground solid-layer conductor 44 on the bottom side to which a fixed connection is set as an initial setting, and the through holes 72 to 78.

Figure 11A:
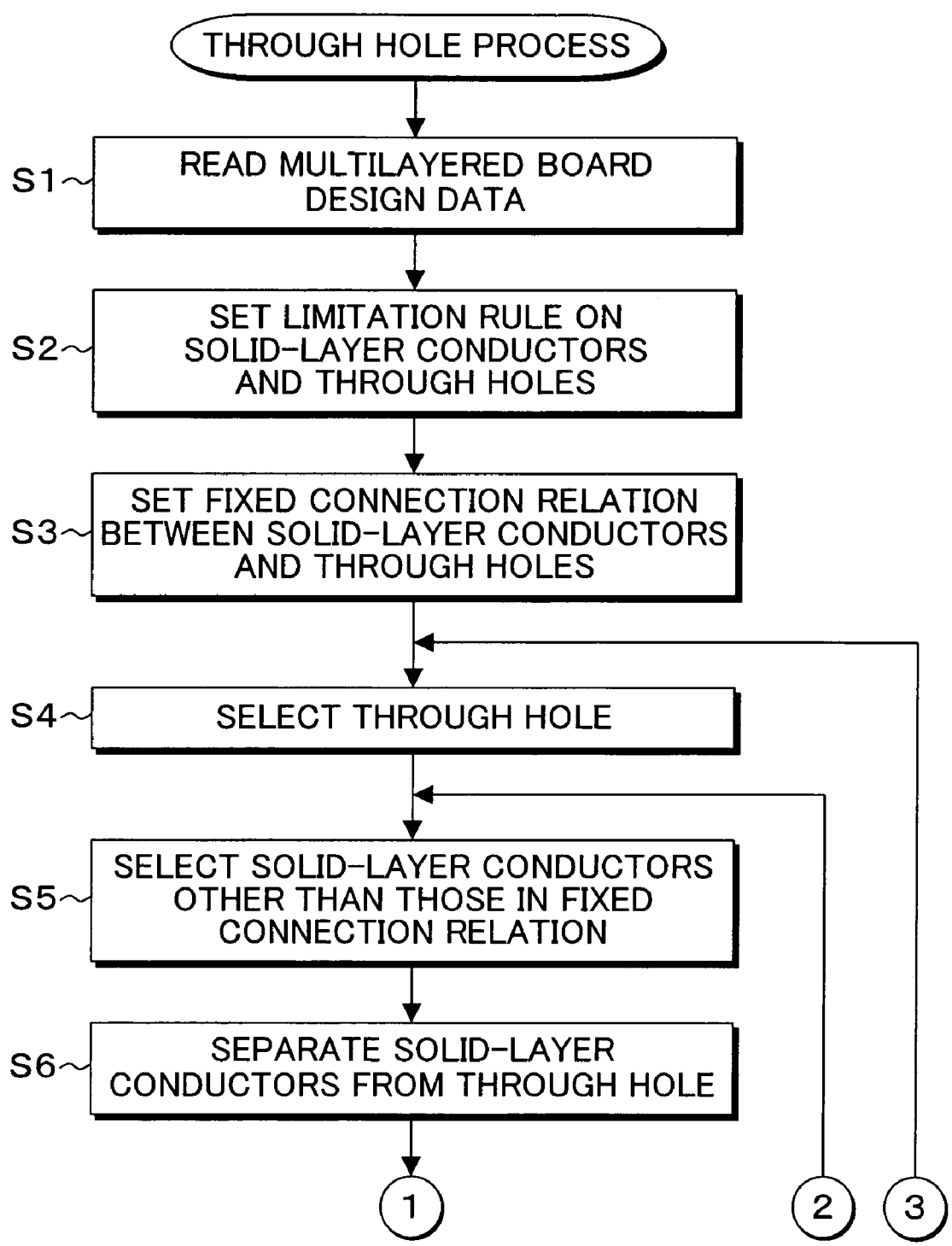
FIGS. 11A and 11B are flowcharts of a through hole process for separating solid-layer conductors according to the present invention.
Figure 11B:
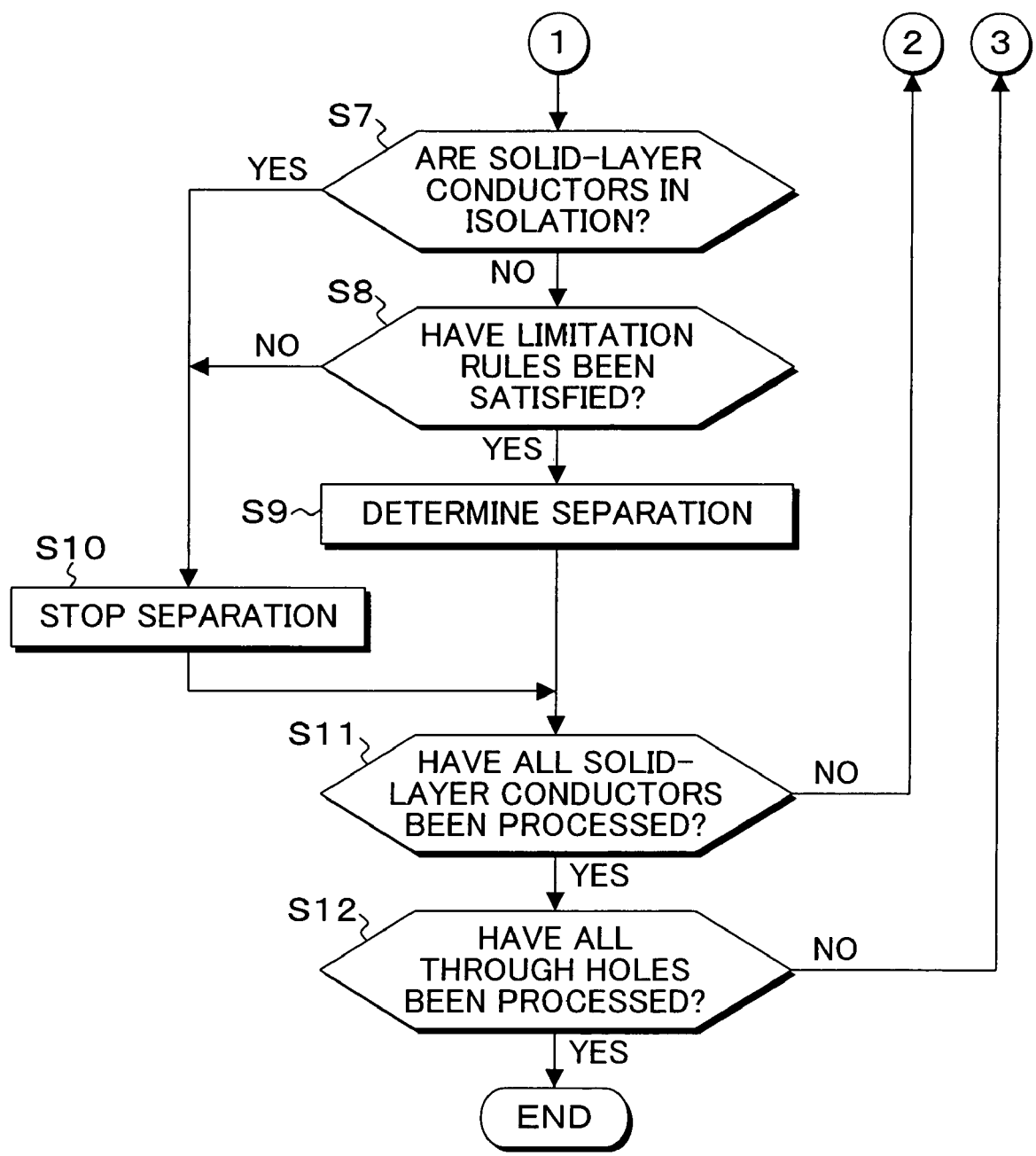

FIGS. 11A and 11B are flowcharts of a through hole process for separating solid-layer conductors, which is described below with reference to FIG. 2. First in step S1, the multilayered board data input unit 30 reads the design-completed multilayered board design data from the interconnection processing unit 20 side. In step S2, the limitation rule setting unit 32 refers to the limitation rule file 28 to set limitation rules regarding solid-layer conductors and through holes, that is, "the number-of-connections limitation rule" and "the separation priority rule". Then in step S3, a fixed connection relation is set in which, even with a separation of the solid-layer conductors and the through holes, the separated solid-layer conductors are not isolated. The in step S4, a first through hole to be processed is selected. In step S5, solid-layer conductors other than those in the fixed connection relation set in step S3 connected to the selected through hole are selected as separation candidates. Then in step S6, the selected solid-layer conductors are separated from the through hole. Then in step S7, it is checked whether the separated solid-layer conductors are isolated from the through hole. If the separated solid-layer conductors have a connection relation with at least one through hole that is present in the multilayered circuit board, the separated solid-layer conductors are not in isolation. If the separated solid-layer conductors are not isolated, it is checked in step S8 whether the imitation rules have been satisfied. For example, in the case where the maximum number of connections Nmax has been set, if the current number of connections after separation is larger than the maximum number of connections Nmax, the limitation rules are regarded as being satisfied, and separation is determined in step S9. On the other hand, if it is determined in step S7 that the separated solid-layer conductors are in isolation, or are not in isolation but it is determined in step S8 that the limitation rules have not been satisfied, the procedure goes to step S10, wherein separation is stopped. Then in step S11, it is checked whether all solid-layer conductors have been processed. If not processed, the procedure returns to step S5 for selecting the next solid-layer conductor to repeat similar processes. If it is determined in step S11 that all solid-layer conductors have been processed, the procedure goes to step S12, wherein all through holes have been processed. If not processed, the procedure returns to step S4 for selecting the next through hole to repeat similar processes. If it is determined in step S12 that all through holes have been processed, a series of through hole processes ends. This flowchart of the through hole process shown in FIGS. 11A and 11B represent process contents of the program of the through hole processing unit 22 in FIG. 2. Here in the above embodiment, a separation process is performed on the connection between the ground solid-layer conductors and the through holes. Similarly, for the power-supply solid-layer conductor, a process of separating a part of the solid-layer conductor connected to a through hole is performed so as to improve solder risability. Also in the above embodiment, "the number-of-connections limitation rule" and "the separation priority rule" are specified as limitation rules at the time of the separation process. A case is also included in the process according to one embodiment of the present invention in which, without the rule setting as described above, only "the solid-layer-conductor isolation prohibition rule" is simply applied in the separation processing unit 34 and the separation results as shown in FIG. 8, for example, are obtained. That is, in the present invention, solder risability can be improved as long as a part of the connection of the solid-layer conductors can be separated from the through holes in the multilayered circuit board. Therefore, a separation process may be performed in which the number of separations is increased as many as possible under only the condition that isolation of the solid-layer conductors by separation is avoided. Furthermore, in the above embodiment, in order to avoid isolation of the solid-layer conductors by separation from the through holes, a fixed connection between the through holes and the solid-layer conductors are first set as an initial setting, and then a separation process is performed. Alternatively, a fixed connection may not be set, and it may be determined during a separation process whether any separated solid-layer conductor is isolated. Still further, the present invention includes appropriate modifications without impairing its objects and advantages, and is also not restricted by numerical values shown in the above embodiment.

What is claimed is:

1. A multilayered circuit board design support method comprising:
   a computer executing
   an input step of inputting design data of a multilayered circuit board provided with a plurality of through holes penetrating and mutually connecting power-supply solid-layer conductors or ground solid-layer conductors disposed in a multilayer manner;

a limitation rule setting step of setting a limitation rule of decreasing the number of solid-layer conductors to be connected to the through holes in the design data; and a separating step of separating connections of the solid-layer conductors from the through holes in the design data based on the limitation rule;

wherein, in the separating step, the solid-layer conductors connected to the through holes are selected for separation from a component surface side opposite to a soldering surface.

2. The multilayered circuit board design support method according to claim 1, wherein, in the separating step, when a solid-layer conductor to be separated from the through holes is selected as a candidate, it is determined whether the solid-layer conductor is isolated from all of the plurality of through holes by separation, when the solid-layer conductor is not isolated, separation is determined, and when the solid-layer conductor is isolated, separation is stopped.

3. The multilayered circuit board design support method according to claim 1, wherein, in the limitation rule setting step, a maximum number, that number is after a solid-layer conductor to be separated from the through holes, of solid-layer conductors to be connected to one through hole is set.

4. The multilayered circuit board design support method according to claim 1, wherein, in the limitation rule setting step, a maximum value of a total of thicknesses of solid-layer conductors to be connected to one through hole is set.

5. The multilayered circuit board design support method according to claim 1, wherein, in the separating step, the solid-layer conductors connected to the through holes are selected for separation preferentially from a solid-layer conductor adjacent to a solid-layer conductor of a different type of power supply.

6. The multilayered circuit board design support method according to claim 1, wherein, in the separating step, the solid-layer conductors connected to the through holes are randomly separated so as to satisfy the limitation rule.

7. The multilayered circuit board design support method according to claim 1, wherein, in the limitation rule setting step, a setting of the limitation rule is changed for each of a power-supply solid-layer conductor and a ground solid-layer conductor.

8. The multilayered circuit board design support method according to claim 1, wherein, in the limitation rule setting step, a setting of the limitation rule is changed in accordance with wiring board specifications including a board thickness, material, and the number of layers of the multilayered circuit board, and joint forms, including an inverse-flower-shaped land, of the solid-layer conductors to the through holes.

9. A computer-readable storage medium which stores a multilayered circuit board design support program causing a computer to execute steps comprising:

an input step of inputting design data of a multilayered circuit board provided with a plurality of through holes penetrating and mutually connecting power-supply solid-layer conductors or ground solid-layer conductors disposed in a multilayer manner;

a limitation rule setting step of setting a limitation rule of decreasing the number of solid-layer conductors to be connected to the through holes in the design data; and a separating step of separating connections of the solid-layer conductors from the through holes in the design data based on the limitation rule;

wherein, in the separating step, the solid-layer conductors connected to the through holes are selected for separation from a component surface side opposite to a soldering surface.

10. The storage medium according to claim 9, wherein, in the separating step, when a solid-layer conductor to be separated from the through holes is selected as a candidate, it is determined whether the solid-layer conductor is isolated from all of the plurality of through holes by separation, when the solid-layer conductor is not isolated, separation is determined, and when the solid-layer conductor is isolated, separation is stopped.

11. The storage medium according to claim 9, wherein, in the limitation rule setting step, a maximum number, that number is after a solid-layer conductor to be separated from the through holes, of solid-layer conductors to be connected to one through hole is set.

12. The storage medium according to claim 9, wherein, in the limitation rule setting step, a maximum value of a total of thicknesses of solid-layer conductors to be connected to one through hole is set.

13. A multilayered circuit board design support apparatus comprising:

an input unit that inputs design data of a multilayered circuit board with a plurality of through holes penetrating and mutually connecting power-supply solid-layer conductors or ground solid-layer conductors disposed in a multilayer manner;

a limitation rule setting unit that sets a limitation rule of decreasing the number of solid-layer conductors to be connected to the through holes in the design data; and a separating unit that separates connections of the solid-layer conductors from the through holes in the design data based on the limitation rule;

wherein, in the separating unit, the solid-layer conductors connected to the through holes are selected for separation from a component surface side opposite to a soldering surface.

14. The multilayered circuit board design support apparatus according to claim 13, wherein, when a solid-layer conductor to be separated from the through holes is selected as a candidate, the separating unit determines whether the solid-layer conductor is isolated from all of the plurality of through holes, when the solid-layer conductor is not isolated, determines separation, and when the solid-layer conductor is isolated, stops separation.

15. The multilayered circuit board design support apparatus according to claim 13, wherein the limitation rule setting unit sets a maximum number that number is after a solid-layer conductor to be separated from the through holes, of solid-layer conductors to be connected to one through hole.

16. The multilayered circuit board design support apparatus according to claim 13, wherein the limitation rule setting unit sets a maximum value of a total of thicknesses of solid-layer conductors to be connected to one through hole.

* * * * *

UNITED STATES PATENT AND TRADEMARK OFFICE
CERTIFICATE OF CORRECTION

PATENT NO. : 7,703,064 B2 Page 1 of 1
APPLICATION NO. : 11/311655
DATED : April 20, 2010
INVENTOR(S) : Takayuki Ashida et al.

It is certified that error appears in the above-identified patent and that said Letters Patent is hereby corrected as shown below:

Column 12, Line 52, change "maximum number" to --maximum number,--.

Signed and Sealed this

Sixth Day of July, 2010

David J. Kappos
*Director of the United States Patent and Trademark Office*